United States Patent [19]

Meignin et al.

[11] Patent Number: 4,487,037
[45] Date of Patent: Dec. 11, 1984

[54] SMALL-SIZED CRYOSTATIC DEVICE FOR PHOTODETECTORS

[75] Inventors: Jacques Meignin; Daniel Mollaret; Roger Prost, all of Paris, France

[73] Assignee: Thomson-CSF, Paris, France

[21] Appl. No.: 512,147

[22] Filed: Jul. 8, 1983

[30] Foreign Application Priority Data

Jul. 16, 1982 [FR] France ............................ 82 12467

[51] Int. Cl.³ .............................................. F25B 19/00
[52] U.S. Cl. ................................... 62/514 R; 250/332
[58] Field of Search ........................ 62/514 R; 250/332

[56] References Cited

U.S. PATENT DOCUMENTS

| | | | |
|---|---|---|---|
| 3,080,542 | 3/1963 | Long | 338/18 |
| 3,259,865 | 7/1966 | Lederhandlor et al. | 338/18 |
| 3,358,463 | 12/1967 | Hawkins et al. | 62/514 R |
| 3,611,746 | 10/1971 | Marsing et al. | 62/514 R |
| 3,851,173 | 11/1974 | Taylor et al. | 250/332 |
| 4,118,947 | 10/1978 | Diedrich et al. | 62/514 R |
| 4,325,530 | 4/1982 | Niemann et al. | 62/514 R |
| 4,340,405 | 7/1982 | Steyert, Jr. et al. | 62/514 R |

OTHER PUBLICATIONS

W. Fastowski et al.: "Kryotechnik" 1970, Akademie-Verlag, Berlin (DE) Chapitre 7.3, Kryostaten, pp. 312-321.

Primary Examiner—Ronald C. Capossela
Attorney, Agent, or Firm—Roland Plottel

[57] ABSTRACT

A small size e.g. 12 mm diameter by 40 mm long cryostatic device with photodetectors. A hollow finger having the photodetectors at one end is adapted to be brought to a very low temperature by a cold fluid circulating in the finger. A wall or housing surrounds finger and provides a vaccuum space surrounding the finger. A window made from a material transparent to the radiation to be detected forms part of the wall and faces the detector. The cold finger is made from a ceramic material which is either a tight ceramic or a sealed ceramic which has low thermal conductivity.

17 Claims, 3 Drawing Figures

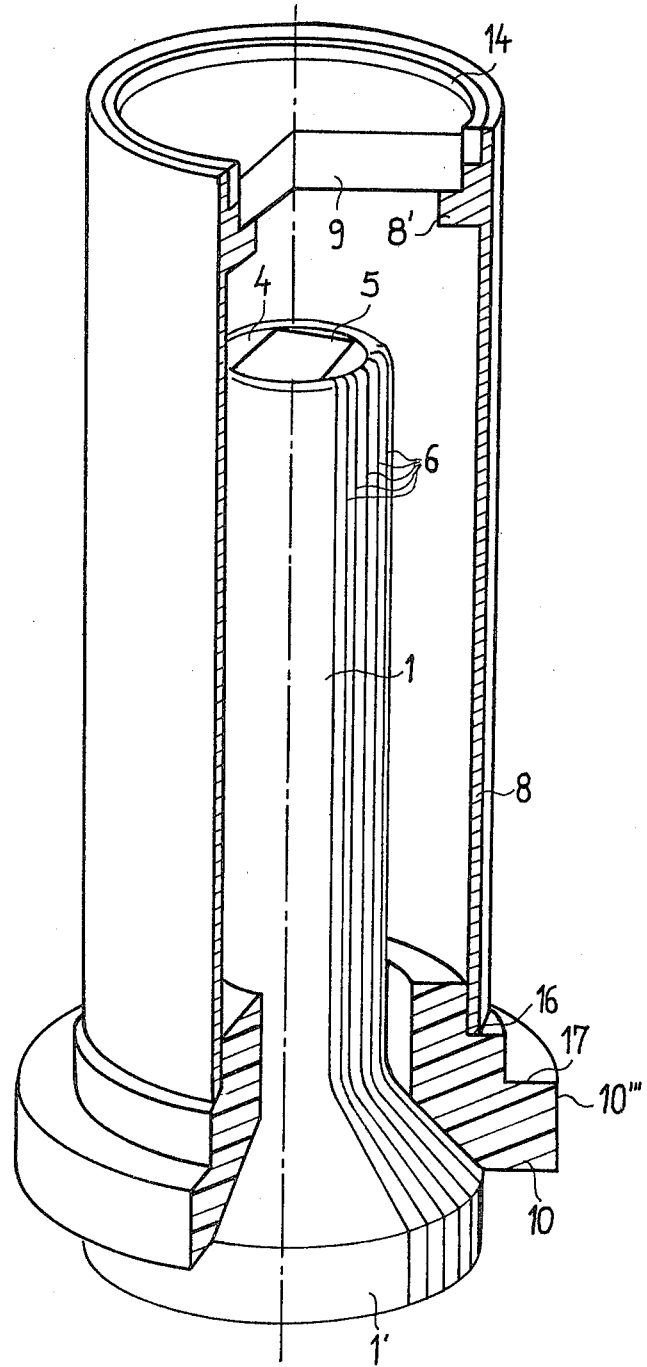

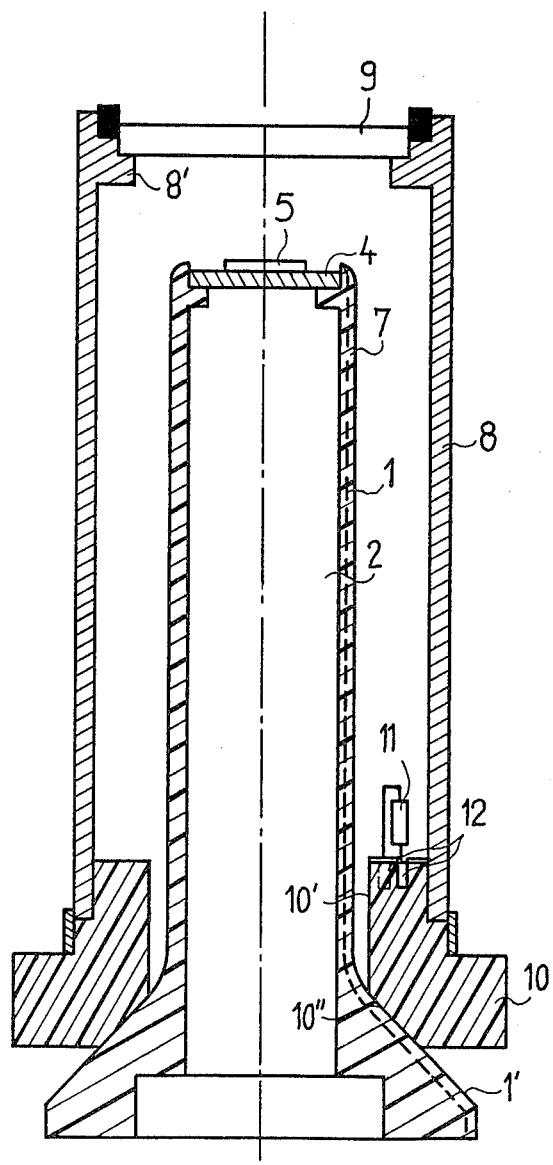

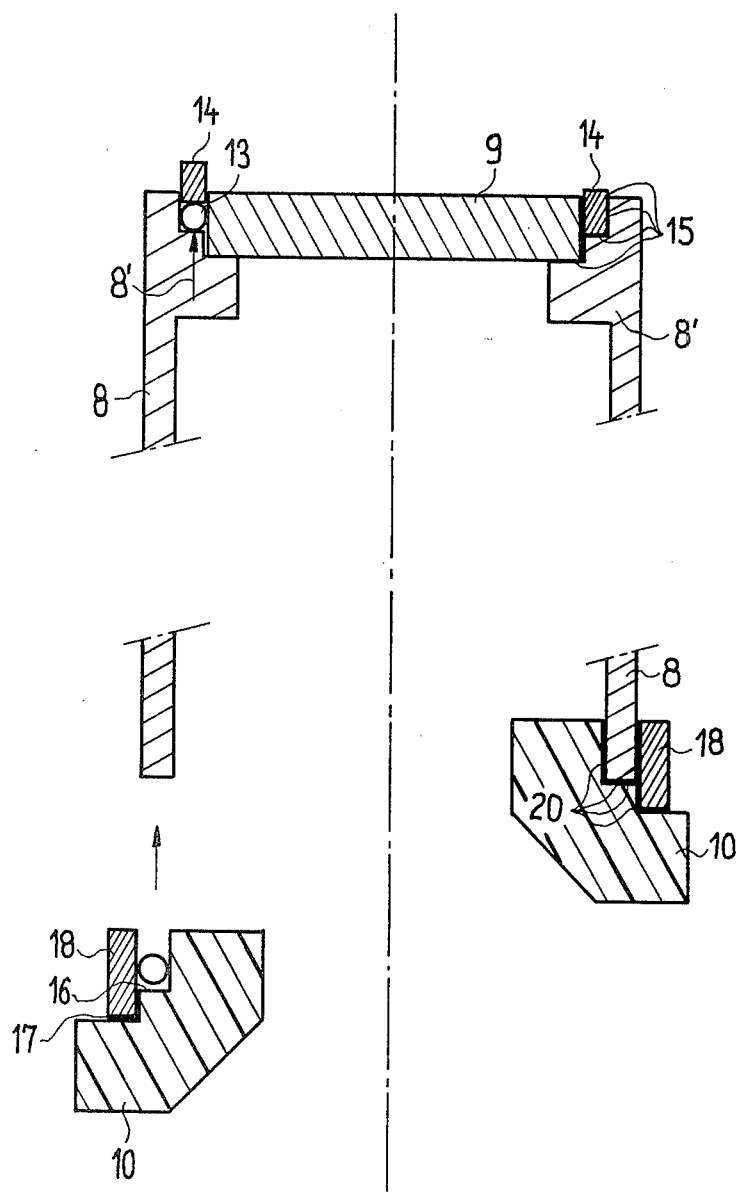

SMALL-SIZED CRYOSTATIC DEVICE FOR PHOTODETECTORS

BACKGROUND OF THE INVENTION

1. Field of the Invention

The present invention relates to a small-sized cryostatic device for photodetectors.

2. Description of the Prior Art

So as to present the highest possible sensitivity to radiations, some detectors such as infra-red detectors must operate at a very low ambient temperature. To obtain this result, the detectors are generally mounted in cryostatic devices of the type comprising a finger brought to a very low temperature on which the detector(s) to be cooled are mounted and which is surrounded by a wall forming a sealed enclosure with said finger. The wall is provided on the part facing the detectors with a window made from a material transparent to the radiations to be detected. The enclosure is moreover evacuated, generally by means of a pumping nipple, for the purpose of avoiding thermal losses around the cold finger. In the prior art devices, the cold finger is conventionally made from glass, the external wall being made from glass or from metal. The use of glass gives rise to certain problems. Thus, because of its malleability when hot, the cryostatic device is easily deformed during sealing together of the two parts and it is difficult to obtain precise dimensions. In addition, machining and grinding of the glass are delicate operations. It is therefor difficult to construct at a lower price a cryostatic device whose external wall may serve as positioning face. Consequently, it is necessary to use additional parts for positioning the cryostatic device. Thus, usually, the cryostatic device is mounted in a precise mechanical part fitting on to the external wall of the cryostatic device properly speaking. However, this mechanical part increases the mass and the space occupied by the cryostatic device.

Furthermore, the detectors are connected to the processing system by conductors whose number depends on the number of detectors mounted in the cryostatic device. Now, the conductors must sealingly pass through the enclosure of the cryostatic device. This may be achieved in numerous ways either at the level of the sealing between the two parts forming the finger and the external wall or by passing directly through the glass or the metal of the external wall. In the case of passing at the level of the sealing, it is necessary to use an additional insulating part, generally made from polyimide, on which the conductors are etched. Furthermore, to avoid any risks of short-circuits, the gap between two conductors must be sufficient, which limits the number of output conductors as a function of the external perimeter of the finger. Moreover, in the case of passing through a metal wall, the metal conductor passes through a glass ball which insulates it from the wall. In fact, all these elements lead to increasing the size of the cryostatic device or in limiting the number of outputs.

Now, infra-red detectors in particular are used more and more in so-called "air-borne" equipments. So attempts have been made to reduce as much as possible the size and weight of the cryostatic device.

SUMMARY OF THE INVENTION

The aim of the present invention is consequently to provide a cryostatic device for photodetectors which presents reduced dimensions with respect to the prior art devices.

Another aim of the present invention is to provide a cryostatic device for photodetectors which does not require the use of any additional positioning part.

A further aim of the present invention is to provide a cryostatic device for photodetectors having a long lifespan despite its small size because a relatively high and stable vacuum is obtained.

Yet another aim of the invention is to provide a small-sized cryostatic device for photodetectors comprising a high number of output conductors which allows a high number of photodetectors to be cooled.

The present invention consequently provides a device in which the different elements forming the cryostatic device properly speaking are made from materials having stable mechanical properties allowing precise machining or molding of these elements.

The small-sized cryostatic device for photodetectors in accordance with the present invention comprises a finger brought to a very low temperature at the end of which is fixed at least one detector and a wall surrounding the cold finger so as to form therewith a vacuum enclosure, a window made from a material transparent to the radiations to be detected being fixed to the wall opposite the detector and it is characterized in that the cold finger is made from a tight or sealed ceramic with low thermal conductivity, the cold finger being sealed so as to allow the electric conductors to pass to a base made from an insulating material having a thermal expansion coefficient compatible with that of the finger and presenting precise mechanical properties, on which base is mounted the external wall of the enclosure.

Among the ceramics which may be used for forming the cold finger, the following may be mentioned: forsterite, zirconia, mullite, steatite. In the case of a porous ceramic such as a porous steatite, it may be made tight by enamelling.

Preferably, the base is also made from ceramic. It is in this case very easy to provide mineral sealing between the finger and the base.

According to another feature of the present invention, the external peripheral contour of the base is used as positioning means. Thus, this contour has preferably a polygonal shape or a shape of revolution and presents a positioning index.

According to an additional feature of the present invention, the conductors are deposited directly on the cold finger by coating, projection, dipping or vacuum evaporation. To facilitate positioning of the conductors, the external surface of the cold finger may be grooved.

According to a further feature of the present invention, the external wall of the cryostatic device is made from a ceramic, a metal or a metal alloy having a thermal expansion coefficient corresponding substantially to that of the base. The metal alloy used is preferably an iron-nickel based alloy such as Kovar (registered trademark) and Dilver P (registered trademark).

The external wall is sealingly mounted to the base by using sealing obtained by causing an indium wire or annulus to flow.

BRIEF DESCRIPTION OF THE DRAWINGS

Other features and advantages of the present invention will appear from the following description of one embodiment made hereafter with reference to the accompanying drawings in which:

FIG. 1 is a perspective view with parts cut away of a cryostatic device in accordance with the invention;

FIG. 2 is a sectional view of the device of FIG. 1; and

FIG. 3 is a sectional view of the base, of the window and of the external wall showing in the left-hand part of the figure the sealing together of the different elements and in the right-hand part the finished sealing.

DESCRIPTION OF THE PREFERRED EMBODIMENT

Referring first of all to FIGS. 1 and 2, reference 1 designates the finger which must be brought to a very low temperature. In accordance with the present invention, finger 1 is made from a gas-tight ceramic with low thermal conductivity such as forsterite, zirconia, mullite, steatite. However, finger 1 may also be made from a porous ceramic made tight, for example, by enamelling. As shown in the figures, finger 1 comprises a main cylindrical part which is bored to receive in its bore 2 a cryogenerator, not shown. The cryogenerator may be formed by any known cryogenerator such as a Joule Thomson expansion probe.

One of the ends of the cylindrical part ends in a part widened out into the form of a cone 1 whereas its other end is closed by a bottom or table 4 on which the detector(s) 5 are mounted. In one embodiment, table 4 may receive a mosaic of detectors comprising $32 \times 32$ elements and has a useful diameter of 4 to 5 mm. The table brought to a low temperature by the cryogenerator must transmit heat rapidly. Therefore, it is made from a good heat-conducting material whose thermal expansion coefficient is compatible with that of finger 1.

Consequently, the table is preferably made either from metal such as platinum, copper, molybdenum etc . . . , or from a ceramic such as alumina, beryllium oxide etc.

Moreover, table 4 is sealingly fixed to the cylindrical part of finger 1 either with an adapted enamel or a vitroceramic.

In accordance with another feature of the present invention, the array of conductors 6 is deposited directly on finger 1. This array of conductors 6 extends from the cold table 4 to the end of the conical part 1', namely the outside of the cryostatic device. This array of conductors may be formed in different ways. By way of illustration, we will describe hereafter different processes for forming said array.

Thus, the conductor array may be formed by depositing a conducting layer over the whole external surface of the finger. Said layer may be formed by a thin layer obtained, for example, by vacuum evaporation or by a thick layer formed by coating, projection or dipping with a paste for silkscreen printing. The conductors are then formed in this layer by mechanical machining, or by laser machining, or by tracing with a hard point or else by photolithography.

In another embodiment, the array of conductors may be obtained by vacuum evaporation through a mask or by vacuum evaporation through a slit. This latter method allows the pitch of the conductors to be varied and, if required, wider conductors to be formed by juxtaposing them. In this method, the slit is preferably maintained fixed, the finger being rotated under the slit after each evaporation operation by means for example of a stepper motor.

In yet another embodiment of the array of conductors finger 1 is provided, at least in the part which is to receive the conductors, with grooves 7 (one of these grooves has been shown with a broken line by way of illustration in FIG. 2). Grooves 7 are formed either by molding or by machining. Preferably, the width of the grooves corresponds to the width of the conductors and their pitch is the pitch of the conductors. A thick layer of a silk-screen printing paste having a thickness of 9 to 10 $\mu$m, or a thin chromium-gold layer, for example, obtained by vacuum evaporation is deposited on the cold finger. Then the conducting layer deposited on the relief parts is removed by machining with a grinding wheel or an abrasive cloth.

In the above cases, the outputs of detectors 5 are connected directly to the array of conductors 6 either by ultrasonic soldering or by evaporation through a mask. Moreover, as explained hereafter, it is not necessary to use additional insulating parts for bringing the array of conductors to the outside of the cryostatic device.

The cryostatic device of the present invention comprises an external wall 8 which surrounds finger 1 and on which is mounted, in the part facing detectors 5, a window 9 made from a material transparent to the radiations to be detected. Wall 8 is formed by a cylindrical casing and comprises at one of its ends an annular internal stop 8' for receiving the window 9. The other end of the external wall 8 is mounted on a base 10 itself sealed to finger 1, the assembly forming an enclosure capable of being evacuated. Base 10 is formed by a sleeve whose central bore has a cylindrical part 10' extended by a conical part 10" corresponding to the conical part 1' of the finger so as to fit exactly on this said part. In accordance with the invention, base 10 is made from an electrically insulating material, having stable and precise mechanical properties and a thermal expansion coefficient equivalent to that of the finger. Consequently, the base is made from ceramic, preferably from the same ceramic as that of finger 1 and it is sealed to part 1' of the finger by means of an enamel or vitroceramic, this type of sealing leaving intact the array of conductors 6 extending over part 1'. Thus conductors 6 pass directly through the seal.

Furthermore, window 9 is made preferably from germanium. Window 9 may be conventionally bonded to the stop 8' of wall 8. However, it will be preferably sealed to this stop by using an indium wire as will be explained in detail hereafter. Wall 8 which is also sealed to base 10 must be made from a material whose thermal expansion coefficient is compatible with that of the window and the base. For, although sealing together of these elements is effected when cold as explained hereafter, in most cases the conditions of use are such that the equipment must operate in a very wide temperature range, in general between $-40°$ C. and $+70°$ C. while maintaining a tight seal. Consequently, wall 8 is made either from ceramic or from a compatible metal such as platinum or from an iron-nickel based metal alloy such as Kovar (registered trademark) and Dilver P (registered trademark). In some cases, wall 8 will be made from a magnetic metal or alloy to provide an detectors protecting electromagnetic shield.

Moreover, since the base is made from a material having precise mechanical properties which may be easily machined or molded, it may be easily used as axial and rotational positioning means for the cryostatic device. To easily obtain positioning, the external peripheral contour 10''' of the base is cylindrical and comprises an indexing means (not shown in the drawings) such as a notch or a slit. However it is obvious to a man skilled in the art that this part of the base could have a polygonal, elliptic shape or any other shape of revolution.

Moreover, at least one getter 11 is implanted in holes 12 provided in base 10. The purpose of the getter is, when it is activated, to maintain the vacuum in the enclosure formed principally by finger 1, base 10 and external wall 8. Moreover, two conductors are deposited on base 10 for connecting the lugs of the getter to an external source for activation thereof by joule effect. The getter is sealed in hole 12 either by using an enamel or by using a silk-screen printing paste which provides, in addition to sealing, the electrical contact between the conductors and the lugs.

There will now be described with reference to FIG. 3 the sealing of window 9 to stop 8' of the external wall 8 and sealing of wall 8 to base 10. This sealing is achieved when cold by causing an indium wire to flow in a very small gap. In the case of window 9, after positioning thereof against stop 8' of wall 8, an indium wire 13 is inserted in the annular gap existing between window 9 and wall 8, then an insert 14 is positioned on the indium wire 13 and the insert is pressed in so as to transform wire 13 into a film 15 which fills the whole space between insert 14, window 9 and stop 8' as shown in the right-hand part of FIG. 3.

For sealing the external wall 8 to base 10, the sleeve forming base 10 has been machined or molded so that its outer surface has two recesses 16,17, the first one having a width substantially equal to the thickness of wall 8. An annular ring 18 is mounted against recess 17 so as to form a groove, then the external wall mounted in an evacuating frame is inserted and pressed into the groove, after pumping and baking of the assembly, so as to cause the indium wire to flow and to transform it into a film which fills the whole space between the ring 18, recess 16 and base 10.

Thus, a cryostatic device is obtained which may have very small dimensions while having a large number of outputs. Thus, in one embodiment, the cryostatic device has a diameter of 12 mm and a length less than 40 mm with 36 output conductors.

The cryostatic device of the invention also has the advantage of being simple, compact, and precise with a reduced cost price.

It is obvious to a man skilled in the art that the cryostatic device of the present invention may be provided with any known device improving its performances. It finds its use particularly in infra-red homing devices and in portable infra-red cameras but also in any equipment requiring cooled detectors of small dimensions.

We claim:

1. A cryostatic device of small dimensions for photodetectors comprising:
   a photodetector,
   a finger adapted to be brought to a very low temperature with said detector fixed at one end of said finger,
   an external housing surrounding said finger and detector, said external housing having a window in a wall facing the detector, said window being made of a material transparent to radiation to be detected,
   a base sealed to said finger and to said external housing and forming a vacuum enclosure between said finger and said housing,
   electric conductors extending from said photodetector at said one end of said finger, along the finger to the other end thereof and exiting between the base and the finger,
   said finger being made of a tight ceramic or a sealed ceramic of a low thermal conductivity, and
   said base being made from an insulating material with a thermal expansion co-efficient compatible with that of the finger.

2. The cryostatic device as claimed in claim 1, wherein the ceramic used for forming the cold finger is chosen from forsterite, zirconia, mullite and steatite.

3. The cryostatic device as claimed in claim 2, wherein, in the case of a porous ceramic, it is made tight by enamelling.

4. The cryostatic device as claimed in claim 1, wherein the base is made from ceramic.

5. The cryostatic device as claimed in claim 1, wherein the external contour of the base is used as axial and rotational positioning means for the cryostatic device.

6. The cryostatic device as claimed in claim 5, wherein the external contour has a polygonal form or a form of revolution and comprises a positioning index.

7. The cryostatic device as claimed in claim 1, wherein the conductors are located directly on an outside surface of the cold finger from the end supporting the detectors to the outside of the cryostatic device.

8. A cryostatic device claimed in claim 1 wherein the finger is provided with groove on its outside surface, and said conductors are positioned in said grooves.

9. The cryostatic device as claimed in claim 1, wherein the external housing of the cryostatic device is made from a ceramic, a metal, or a metal alloy, having a thermal expansion coefficient substantially equal to that of the base.

10. The cryostatic device as claimed in claim 9, wherein the metal or metal alloy is a magnetic material.

11. The cryostatic device as claimed in claim 9, wherein the metal alloy is an iron-nickel based alloy.

12. The cryostatic device as claimed in claim 1 wherein a seal between the external housing and the base, and/or a seal at the window comprises indium.

13. A device according to claim 1 wherein said device has an outside diameter of less than approximately 12 mm and a length less than approximately 40 mm.

14. A device according to claim 1 wherein said detector comprises a plurality of detectors and said conductors include 3 dozen output conductors.

15. A cryostatic device comprising (a) a hollow, low, thermal conductivity ceramic finger with a detector at one end and open at the other end, and adapted to receive a coolant at said open end, (b) a hollow housing with a window at one end, (c) a base joining said housing to said finger with a vacuum space between said housing and finger, said window being positioned to permit radiation to pass therethrough to said detector, (d) conductors extending from said detector directly on an outside surface of said finger in said vacuum space past said joining and to the outside of said device.

16. A device according to claim 14 wherein said housing has an outside diameter of less than approximately 12 mm, and the overall length of said housing is less than approximately 40 mm.

17. A device according to claim 16 wherein said detector comprises a plurality of detectors and the conductors connect said detectors to the outside of said device are at least 3 dozen.

* * * * *